(12) United States Patent
Kondoh et al.

(10) Patent No.: US 11,872,656 B2
(45) Date of Patent: Jan. 16, 2024

(54) CORE MATERIAL, ELECTRONIC COMPONENT AND METHOD FOR FORMING BUMP ELECTRODE

(71) Applicant: SENJU METAL INDUSTRY CO., LTD., Tokyo (JP)

(72) Inventors: Shigeki Kondoh, Tokyo (JP); Masato Tsuchiya, Tokyo (JP); Hiroki Sudo, Tokyo (JP); Hiroshi Okada, Tokyo (JP); Daisuke Souma, Tokyo (JP)

(73) Assignee: SENJU METAL INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 17/610,876

(22) PCT Filed: Sep. 30, 2020

(86) PCT No.: PCT/JP2020/037042
§ 371 (c)(1),
(2) Date: Nov. 12, 2021

(87) PCT Pub. No.: WO2021/079702
PCT Pub. Date: Apr. 29, 2021

(65) Prior Publication Data
US 2022/0212294 A1    Jul. 7, 2022

(30) Foreign Application Priority Data
Oct. 25, 2019  (JP) .................. 2019-194731

(51) Int. Cl.
*C22C 13/02* (2006.01)
*B23K 35/26* (2006.01)
*B23K 103/08* (2006.01)
*H05K 3/34* (2006.01)

(52) U.S. Cl.
CPC ............ *B23K 35/262* (2013.01); *C22C 13/02* (2013.01); *B23K 2103/08* (2018.08); *H05K 3/34* (2013.01)

(58) Field of Classification Search
CPC .................................................. B23K 35/262
See application file for complete search history.

(56) References Cited

U.S. PATENT DOCUMENTS

| | | |
|---|---|---|
| 2015/0217408 A1 | 8/2015 | Kawasaki et al. |
| 2016/0244891 A1 | 8/2016 | Son et al. |
| 2017/0252871 A1 | 9/2017 | Kawasaki et al. |
| 2018/0158790 A1 | 6/2018 | Ahn et al. |
| 2018/0174991 A1 | 6/2018 | Nishino et al. |

FOREIGN PATENT DOCUMENTS

| | | | |
|---|---|---|---|
| CN | 109693054 | 4/2019 | |
| EP | 3 187 299 | 7/2017 | |
| JP | 2000-24791 | 1/2000 | |
| JP | 2007-81141 | 3/2007 | |
| JP | 5367924 | 12/2013 | |
| JP | 2015-147951 | 8/2015 | |
| JP | 6217836 | 10/2017 | |
| JP | 2018-89677 | 6/2018 | |
| JP | 2018-89683 | 6/2018 | |
| KR | 10-2015-0091999 | 8/2015 | |
| KR | 10-2018-0064679 | 6/2018 | |
| KR | 10-2018-0065952 | 6/2018 | |
| TW | 201527030 | 7/2015 | |
| WO | WO-2014207897 A1 * | 12/2014 | ............. B22F 1/025 |
| WO | 2016/031067 | 3/2016 | |
| WO | 2018/056313 | 3/2018 | |

OTHER PUBLICATIONS

English machine translation of WO 2014-207897 A1 of Kawasaki (Year: 2014).*
International Search Report dated Dec. 8, 2020 in International (PCT) Application No. PCT/JP2020/037042.
Notice of Allowance dated Aug. 11, 2022 in corresponding Chinese Patent Application No. 202080030861.8, with English translation.
Extended European Search Report dated Dec. 15, 2022, in corresponding European Patent Application No. 20878745.7.

* cited by examiner

*Primary Examiner* — Jophy S. Koshy
(74) *Attorney, Agent, or Firm* — WENDEROTH, LIND & PONACK, L.L.P.

(57) ABSTRACT

A core material has a core 12; a solder layer 16 made of a (Sn—Bi)-based solder alloy provided on an outer side of the core 12; and a Sn layer 20 provided on an outer side of the solder layer 16. The core contains metal or a resin. When a concentration ratio of Bi contained in the solder layer 16 is a concentration ratio (%)=a measured value of Bi (% by mass)/a target Bi content (% by mass), or a concentration ratio (%)=an average value of measured values of Bi (% by mass)/a target Bi content (% by mass), the concentration ratio is 91.4% to 106.7%. The thickness of the Sn layer 20 is 0.215% or more and 36% or less of the thickness of the solder layer 16.

4 Claims, 10 Drawing Sheets

CORE MATERIAL, ELECTRONIC COMPONENT AND METHOD FOR FORMING BUMP ELECTRODE

TECHNICAL FIELD

The present embodiment relates to a core material, an electronic component having a bump using this core material, and a method for forming a bump electrode.

The present application claims the priority of Japanese Patent Application No. 2019-194731 filed on Oct. 25, 2019, the contents of which are entirely incorporated by reference.

BACKGROUND ART

In recent years, with development of a small information device, size of an electronic component mounted on the information device is rapidly being reduced. A ball grid array (BGA) with an electrode disposed on a rear surface of the BGA is applied as the electronic component in order to correspond to narrowing a connection terminal and reducing mounting area according to a demand for miniaturization.

An example of the electronic component to which the BGA is applied includes a semiconductor package. The semiconductor package is configured by sealing a semiconductor chip having an electrode with a resin. A solder bump is formed on the electrode of the semiconductor chip. The solder bump is formed by bonding a solder ball to the electrode of the semiconductor chip. The semiconductor package to which the BGA is applied is mounted on a printed circuit board by bonding the solder bump melted by heating to a conductive land of the printed circuit board. In recent years, in order to meet the demand for higher-density mounting, a three-dimensional high-density mounting in which semiconductor packages are stacked in a height direction has also been developed.

When the semiconductor package obtained with the three-dimensional high-density mounting is the BGA and the solder ball is placed on the electrode of the semiconductor chip and reflowed, the solder ball may be crushed due to weight of the semiconductor package itself. When such a situation occurs, there is a problem that the solder extrudes from electrodes to bring the electrodes into contact with each other, and a short-circuit between the electrodes is caused.

In order to prevent such a short-circuit from occurring, a solder bump that is not crushed due to the weight of the semiconductor package itself and is not deformed when the solder is melted is proposed as a solder ball. Specifically, it is proposed to use a ball molded of metal or a resin as a core, and to use a core material obtained by coating the core with a solder as a solder bump.

JP 5367924 B1 discloses a solder bump in which a Cu ball is used as a core and a Sn-based solder alloy formed of Sn and Bi is plated on the Cu ball. A plating treatment is performed at a concentration gradient in which a content of Bi contained in a solder plating layer in JP 5367924 B1 is high on an inner side (inner circumferential side) and is lower as being directed toward an outer side (outer circumferential side).

As in JP 5367924 B1, when a solder is heated and melted in a state in which a concentration of Bi in the solder plating layer is high on the inner circumferential side and is low on the outer circumferential side, a density of Bi on the inner circumferential side is high. Therefore, the solder begins to be melted from a Bi region on the inner circumferential side. Even when the Bi region on the inner circumferential side is melted, the Bi region on the outer circumferential side has yet to begin to be melted.

Therefore, a volume expansion in the Bi region on the inner circumferential side occurs early. Due to a slow volume expansion on the inner and outer circumferential sides, a situation occurs in which a pressure difference is generated between the inner circumferential side and the outer circumferential side (outside air) of Bi, and the pressure difference due to the volume expansion on the inner circumferential side causes the Cu ball, which is a core, to burst open when the outer circumferential side of Bi begins to be melted. The occurrence of the situation has to be avoided. As described above, a defect has been generated in a Cu core ball having a solder plating layer formed of the Sn-based solder alloy formed of Sn and Bi when Bi in the solder plating layer has a concentration gradient.

JP 6217836 B1 is proposed in order to solve the above-described problems caused in JP 5367924 B1. In JP 6217836 B1, in a core material having a solder plating layer formed by plating a (Sn—Bi)-based solder alloy formed of Sn and Bi on a core surface, the core material is provided in which Bi contained in the solder plating layer is distributed in a concentration ratio within a predetermined range of 91.4% to 106.7% in the solder plating layer.

SUMMARY OF INVENTION

Problem to be Solved by Invention

When an aspect such as JP 6217836 B1 is adopted, since a relatively larger amount of Bi are contained in the surface of the solder plating layer, yellowness may increase, which causes a color of the surface of the solder plating layer to be black, and thus it is determined to be defective in a visual inspection.

As described above, since the surface of the solder plating layer contains a relatively larger amount of Bi, oxidation tends to proceed easily, and an oxide film thickness tends to increase. When the oxide film becomes thick as described above, a melting behavior at the time of a substrate reflow deteriorates, which may cause the solder ball to come off the electrode pad (ball missing) or cause misalignment.

The present invention provides a core material and so on that is unlikely to be determined to be defective in a visual inspection and can prevent the oxide film thickness from increasing.

Means for Solving Problem

[Concept 1]

A core material according to the present invention may comprise:

a core having 0.95 or more sphericity;

a solder layer made of a (Sn—Bi)-based solder alloy provided on an outer side of the core; and a Sn layer provided on an outer side of the solder layer, wherein when a concentration ratio of Bi contained in the solder layer is a concentration ratio (%)=a measured value of Bi (% by mass)/a target Bi content (% by mass), or a concentration ratio (%)=an average value of measured values of Bi (% by mass)/a target Bi content (% by mass), the concentration ratio may be 91.4% to 106.7%,
a thickness of the solder layer on one side is 1 μm or more,
a thickness of the Sn layer may be 0.1 μm to 12 μm on one side, and
the thickness of the Sn layer may be 0.215% or more and 36% or less of the thickness of the solder layer.

[Concept 2]

A core material according to the present invention may comprise:
a core having 0.95 or more sphericity;
a solder layer made of a (Sn-58Bi)-based solder alloy provided on an outer side of the core; and
a Sn layer provided on an outer side of the solder layer, wherein
when a concentration ratio of Bi contained in the solder layer is a concentration ratio (%)=a measured value of Bi (% by mass)/a target Bi content (% by mass), or a concentration ratio (%)=an average value of measured values of Bi (% by mass)/a target Bi content (% by mass), the concentration ratio may be 91.4% to 108.6%,
a thickness of the solder layer on one side may be 1 μm or more,
a thickness of the Sn layer may be 0.1 μm to 12 μm on one side, and
the thickness of the Sn layer may be 0.215% or more and 36% or less of the thickness of the solder layer.

[Concept 3]

A core material according to the present invention may comprise:
a core having 0.95 or more sphericity;
a solder layer made of a (Sn-40Bi)-based solder alloy provided on an outer side of the core; and
a Sn layer provided on an outer side of the solder layer, wherein
when a concentration ratio of Bi contained in the solder layer is a concentration ratio (%)=a measured value of Bi (% by mass)/a target Bi content (% by mass), or a concentration ratio (%)=an average value of measured values of Bi (% by mass)/a target Bi content (% by mass), the concentration ratio may be 90% to 107.5%, a thickness of the solder layer on one side may be 1 μm or more,
a thickness of the Sn layer may be 0.1 μm to 12 μm on one side, and
the thickness of the Sn layer may be 0.215% or more and 36% or less of the thickness of the solder layer.

[Concept 4]

In the core material according to concept 3,
a target composition of the (Sn-40Bi)-based solder alloy may be Sn-40Bi-0.5Cu.

[Concept 5]

A core material according to the present invention may comprise:
a core having 0.95 or more sphericity;
a solder layer made of a (Sn-3Bi)-based solder alloy provided on an outer side of the core; and
a Sn layer provided on an outer side of the solder layer, wherein
when a concentration ratio of Bi contained in the solder layer is a concentration ratio (%)=a measured value of Bi (% by mass)/a target Bi content (% by mass), or a concentration ratio (%)=an average value of measured values of Bi (% by mass)/a target Bi content (% by mass), the concentration ratio may be 90% to 106.7%,
a thickness of the solder layer on one side is 1 μm or more,
a thickness of the Sn layer may be 0.1 μm to 12 μm on one side, and
the thickness of the Sn layer may be 0.215% or more and 36% or less of the thickness of the solder layer.

[Concept 6]

In the core material according to any one of concepts 1 to 5, a base plating layer made of one or more elements selected from Ni and Co may be provided between the core and the solder layer.

[Concept 7]

In the core material according to any one of concepts 1 to 6, Cu ball or Cu column may be used as the core.

[Concept 8]

An electronic component may use the core material according to any one of concepts 1 to 7 as a solder bump.

[Concept 9]

A method according to the present invention for forming bump electrode may comprise steps of:
mounting the core material according to any one of concepts 1 to 7 on an electrode;
forming a bump electrode by heating the mounted core material.

Effect of Invention

The present invention can provide a core material and so on that is unlikely to be determined to be defective in a visual inspection and can prevent the oxide film thickness from increasing.

EMBODIMENT FOR CARRYING OUT INVENTION

Figure 1:
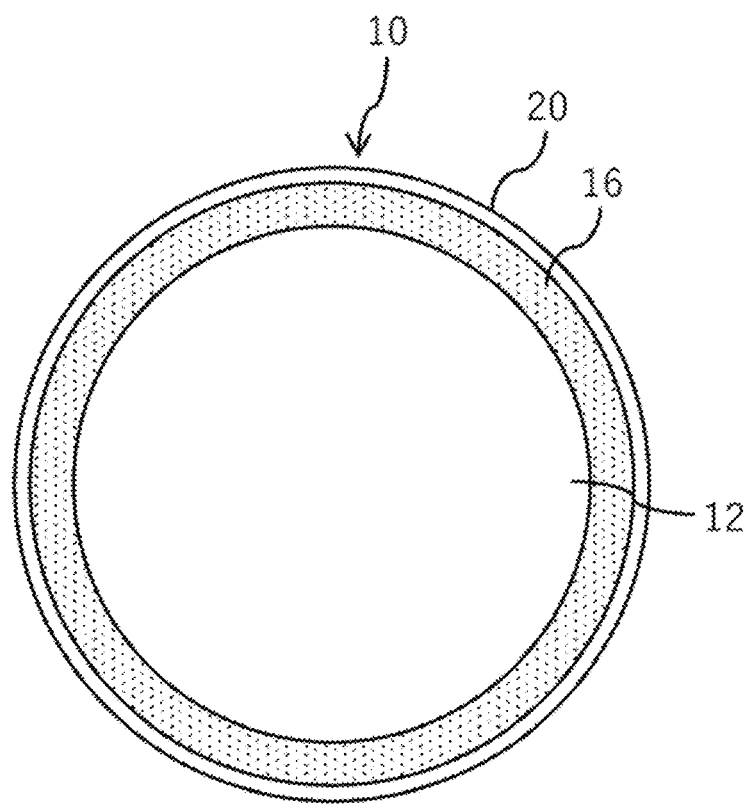
FIG. 1 is a cross-sectional view illustrating an example of a Cu core ball according to an embodiment of the present invention.

Hereinafter, preferred embodiments of the present embodiment will be described in detail. In the embodiment, a core material and an electronic component including a semiconductor package using the core material are provided.

Each material of the embodiment may include a core, a solder layer formed of a (Sn—Bi)-based solder alloy provided on an outer side of the core, and a Sn layer (tin layer) provided on an outer side of the solder layer. The core may contain metal or a resin. A concentration ratio of Bi contained in the solder layer may be 90% to 108.6% when being a concentration ratio (%)=a measured value of Bi (% by mass)/a target Bi content (% by mass), or a concentration ratio (%)=an average value of measured values of Bi (% by mass)/a target Bi content (% by mass). when more limited, the concentration ratio may be 91.4% to 106.7%.

In the present embodiment, the (Sn—Bi)-based solder alloy means a solder alloy containing Sn and Bi. A (Sn-58Bi)-based solder alloy is a solder alloy containing Sn and Bi, and means the solder alloy of which the target Bi content (% by mass) is 58% by mass. A (Sn-40Bi)-based solder alloy is a solder alloy containing Sn and Bi, and means the solder alloy of which the target Bi content (% by mass) is 40% by mass. Therefore, the (Sn-40Bi)-based solder alloy also contains Sn-40Bi-0.5Cu and Sn-40Bi-0.5Cu-0.03Ni shown in Examples which will be described later. A (Sn-3Bi)-based solder alloy is a solder alloy containing Sn and Bi, and means the solder alloy of which the target Bi content (% by mass) is 3% by mass. Therefore, the (Sn-3Bi)-based solder alloy also contains Sn-3 μg-0.8Cu-3Bi shown in Examples which will be described later.

A Sn layer may be formed with a thickness of 0.215% or more and 36% or less, preferably 0.26% or more and 33.3% or less of the thickness of the solder layer. In the embodiment, as an example, the solder layer is described by using a solder plating layer, and the Sn layer is described by using a Sn plating layer, but the present invention is not limited to this. The solder layer may be formed by a method other than the plating method, and similarly, the Sn layer may be formed by a method other than the plating method. The Sn layer may contain components other than Sn as impurities such as Ag, Cu, Bi, Sb, Ni, Co, Ge, Ga, Fe, Al, In, Cd, Zn, Pb, Au, P, S and Si.

The Sn plating layer is formed after the solder plating layer is formed. As an example, a solder plating layer having a uniform Bi concentration is formed on the core. Then, after the core material on which the solder plating layer is formed is pulled up from a molten liquid containing Sn and Bi, the core material may be immersed in a molten liquid of Sn to form the Sn plating layer. Both the solder plating layer and the Sn plating layer may be formed by using barrel electroplating.

A Bi concentration ratio (%) used in the embodiment is a ratio (%) of a measured value of Bi (% by mass) to a target Bi content (% by mass) or a ratio (%) of an average value of measured values of Bi (% by mass) to a target Bi content (% by mass) in a predetermined region of the solder plating layer. Since the Bi content in the predetermined region can be replaced with the Bi concentration in the predetermined region, the Bi concentration ratio (%) used in the embodiment is a ratio (%) of the measured Bi concentration to the target Bi concentration or a ratio (%) of an average value of the measured Bi concentrations to the target Bi concentration in the predetermined region of the solder plating layer.

In measuring the Bi content of the solder plating layer, the solder plating layer is melted by such as an oxo acid and then a known analysis method such as ICP-AES, and ICP-MS can be used.

A composition of the solder plating layer of the embodiment may be formed of the (Sn—Bi)-based alloy containing Sn and Bi. Regarding the content of Bi, when the amount of Bi is in a range of 0.1% by mass to 99.9% by mass with respect to the entire alloy, the concentration ratio of Bi can be controlled within a range of 90% to 108.6%, and a distribution of Bi in the solder plating layer can be made uniform.

Bi in the solder plating layer is processed so that the concentration distribution of Bi is uniform with respect to a plating thickness as being directed from the inner circumferential side toward the outer circumferential side, and over the entire region including the inner circumferential side and the outer circumferential side (however, when a base plating layer such as Ni plating is applied to the core, the base plating layer is excluded).

The Sn-based solder alloy can contain other additive elements in addition to the (Sn—Bi)-based solder alloy. There is one or more of Ag, Cu, Ni, Ge, Ga, In, Zn, Fe, Pb, Sb, Au, Pd, Co, and the like as an element that can be added to the (Sn—Bi)-based solder alloy. For example, a (Sn—Bi—Cu—Ni)-based solder alloy, a (Sn—Ag—Cu—Bi)-based solder alloy, or the like can be considered.

For example, in a case of the (Sn-58Bi)-based solder alloy, the target value of the distribution of Bi is 58% by mass, but an allowable range is 53% by mass (concentration ratio of 91.4%) to 63% by mass (concentration ratio 108.6%). In a case of the (Sn-40Bi)-based solder alloy, the target value of the distribution of Bi is 40% by mass, but an allowable range is 36% by mass (concentration ratio of 90%) to 43% by mass (concentration ratio 107.5%). In a case of the (Sn-3Bi)-based solder alloy, the target value of the distribution of Bi is 3% by mass, but an allowable range is 2.7% by mass (concentration ratio of 90%) to 3.2% by mass (concentration ratio 106.7%).

The allowable range is a range in which soldering such as a bump formation can be performed without any problem when the Sn layer has a thickness of 0.215% or more and 36% or less of the thickness of the solder layer and the thickness of the Sn layer is within the range. The concentration ratio (%) is a ratio (%) of the measured value (% by mass) to the target content (% by mass) or a ratio (%) of an average value of the measured values (% by mass) to the target content (% by mass). That is, as described above, the concentration ratio (%) is represented by a concentration ratio (%)=a measured value (% by mass)/a target content (% by mass), or a concentration ratio (%)=an average value of measured values (% by mass)/a target content (% by mass).

Even when other additive elements are added to the solder plating layer formed of two elements of Sn and Bi, the concentration ratio of Bi can be controlled within the range of 90% to 108.6%.

One or more of Ag, Cu, Ni, Ge, Ga, In, Zn, Fe, Pb, Sb, Au, Pd, Co, and the like is conceivable to be used as the additive element.

As described above, metal or a resin is conceivable as the core, and a shape of the core is conceivable to be a sphere or other shape (columnar column, sheet shape, and the like). In the embodiment, a case of a Cu core ball which is a sphere and uses a ball which is, particularly, formed of Cu as the core (also referred to as "Cu ball") will be described. The Cu core ball in the embodiment only needs to contain Cu in the core, and other configurations are not particularly limited.

A particle diameter (sphere diameter) of the core differs depending on size of the BGA, but in the following example, the core has a spherical shape of about 300 µmφ and a thickness of the solder plating layer on one side in a diameter direction is 1 µm to 100 µm, and preferably 10 µm to 50 µm. A thickness of the Sn plating layer on one side in the diameter direction may be determined based on the thickness of the solder plating layer, and the thickness of the Sn plating layer on one side in the diameter direction is 0.215% or more and 36% or less of the thickness of the solder plating layer, preferably 0.26% or more and 33.3% or less of the thickness of the solder plating layer. The particle diameter of the Cu core ball is appropriately selected according to a density and size of the electronic components to be used. Therefore, the core having the particle diameter in a range of 1 µm to 1000 µm can be used, and the plating thickness can be appropriately selected according to the particle diameter of the core to be used. A typical particle diameter when being used as a ball is 200 µm to 300 µm. When the particle diameter is further minimized in the future, a mainstream particle diameter may be 100 µm to 160 µm, and the present application can be used without any problem even with this particle diameter. As a plating apparatus that performs the plating treatment, an electroplating apparatus may be used.

Figure 2:
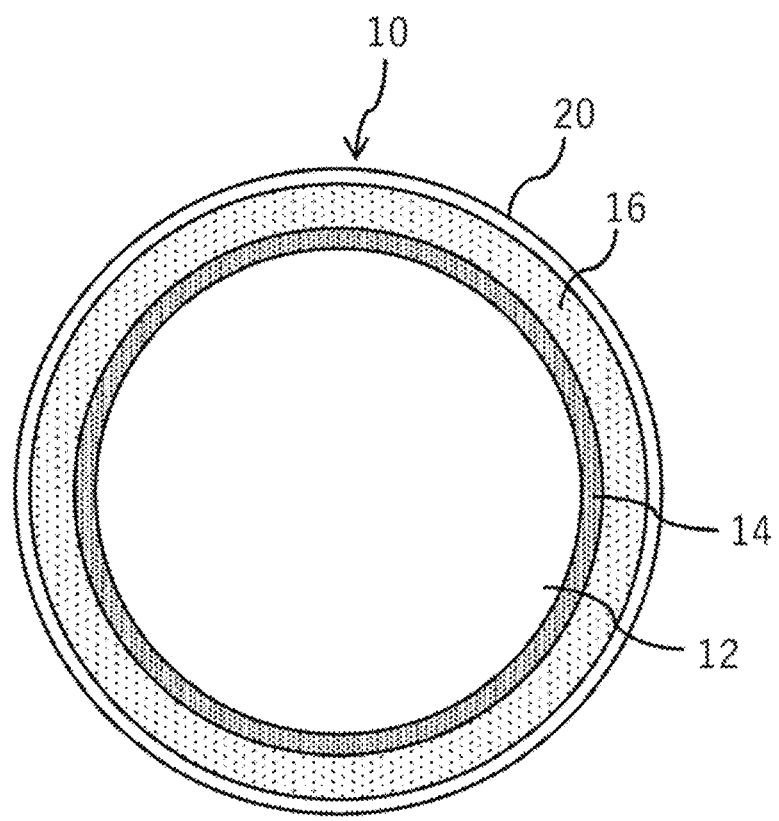
FIG. 2 is a cross-sectional view illustrating another example of a Cu core ball according to an embodiment of the present invention.

Subsequently, an example of the Cu core ball using the Cu ball as a core will be described. FIGS. 1 and 2 are cross-sectional views illustrating an example of a Cu core ball 10 according to the embodiment of the present invention.

As illustrated in FIG. 2, in the Cu core ball 10, a core 12 containing Cu and a solder plating layer 16 formed of the Sn-based solder alloy are formed via a Ni base plating layer 14 in the example, and a Sn plating layer 20 is formed on the solder plating layer 16. The Ni base plating layer 14 functions as a base plating (functions as a barrier layer) for preventing a composition change of the solder plating layer 16 due to a metal diffusion between the core 12 and the solder plating layer 16, and a thickness of the Ni base plating layer 14 on one side is about 1 µm to 4 µm. The Ni base plating layer 14 is not an indispensable requirement, and the solder plating layer can be formed directly on the surface of the core 12 as illustrated in FIG. 1 When forming the base plating layer 14, the base plating layer 14 may be configured of a layer formed of one element or more selected from the group consisting of Ni and Co.

Cu used in the core 12 may be pure copper or an alloy of copper.

When the core 12 having an alloy composition containing Cu as a main component is used, purity of Cu is not particularly limited, but from a viewpoint of suppressing deterioration of electric conductivity and thermal conductivity of the Cu core ball due to a decrease in purity and suppressing α-rays as necessary, the purity of Cu is preferably 99.9% by mass or more.

The core may be formed of a metal simple substance of Ni, Ag, Bi, Pb, Al, Sn, Fe, Zn, In, Ge, Sb, Co, Mn, Au, Si, Pt, Cr, La, Mo, Nb, Pd, Ti, Zr, Mg, an alloy made from two or more of these components, a metal oxide, or a metal mixture oxide in addition to Cu, and may be formed of a resin material. As the resin material, a resin material formed of an amino resin, an acrylic resin, an ethylene-vinyl acetate resin, a styrene-butadiene block copolymer, a polyester resin, a melamine resin, a phenol resin, an alkyd resin, a polyimide resin, a urethane resin, an epoxy resin, a cross-linked resin, or the like is exemplified. Of these, it is preferable to use conductive plastic such as polyacetylene, polypyrrole, polythiophene, and polyaniline. When the core is formed of the resin material, the Cu core ball can be formed by a resin core, a Cu plating layer coating an outer side of the resin core, a base plating layer such as Ni coating a surface of the Cu plating layer, and a solder plating layer coating a surface of the base plating layer. A laminated structure of the Cu core ball is not limited to the above example.

From a viewpoint of controlling a stand-off height, sphericity of the core 12 is preferably 0.95 or more, and more preferably 0.990 or more. When the sphericity of the core 12 is less than 0.95, the core 12 has an indefinite shape. Therefore, a bump having a height which is not uniform is formed at the time of forming the bump, and the possibility of causing defective bonding increases. Further, when the Cu core ball 10 is mounted on the electrode and reflowed, and the sphericity is low, the Cu core ball 10 is misaligned and a self-alignment property deteriorates.

Here, the sphericity represents a deviation from the sphere. The sphericity is obtained by various methods such as a least squares center method (LSC method), a minimum zone center method (MZC method), a maximum inscribed center method (MIC method), and a minimum circumscribed center method (MCC method). Specifically, the sphericity is an arithmetic average value calculated when the diameter of each of 500 cores is divided by a long diameter, and the closer the value is to the upper limit of 1.00, the closer to the sphere. The length of the long diameter is a length measured by ULTRA QV350-PRO measurement device (ultra quick vision manufactured by MITUTOYO CORPORATION).

It is preferable that the diameter of the entire Cu core ball 10 including the solder plating layer 16 is 1 µm to 1000 µm. Within this range, the spherical Cu core ball 10 can be stably manufactured, and by selecting the particle diameter, it is possible to suppress a connection short circuit when there is a narrow pitch between the electrode terminals.

The solder plating layer 16 is a solder alloy, and is formed of Sn and Bi in the example. In this case, as described above, as the allowable range, the Bi content in the solder plating layer 16 is preferably about 53% by mass (concentration ratio of 91.4%) to 63% by mass (concentration ratio of 108.6%) with respect to the target value of 58% by mass.

The thickness of the solder plating layer 16 varies depending on the particle diameter of the core 12, but the thickness of the solder plating layer 16 on one side in the diameter direction is preferably 100 μm or less. For example, when the core 12 has a particle diameter of 300 μmφ, the solder plating layer 16 is formed so as to have a thickness of 1 μm to 100 μm on one side. This is for securing a sufficient amount of solder bonding.

A mixed liquid of an organic acid, methane sulfonic acid Bi and a surfactant is used as a plating liquid. The concentration of the plating liquid is controlled to be constant during the formation of the solder plating layer.

When the solder plating layer having a composition of the Sn—Bi-based solder alloy formed of Sn and Bi is formed by electroplating, Bi is introduced into the solder plating layer prior to Sn. Therefore, there is a problem that the Bi concentration in the electroplating liquid is not coincident with the amount of Bi in the solder plating layer, and a solder alloy plating layer having a uniform concentration distribution of Bi cannot be formed. Accordingly, the Bi concentration in the liquid is adjusted to be uniform and an electroplating treatment is performed while applying a predetermined DC voltage between an anode electrode and a cathode electrode and oscillating the core by using the barrel electroplating.

The process of forming the solder plating layer 16 by the plating treatment will be described with reference to FIGS. 6 to 9. FIGS. 6 to 9 are characteristic curve graphs illustrating a relationship between the Bi concentration in the plating liquid in the electroplating treatment (curve Lb and curve Ld) and the Bi concentration in the solder plating layer 16 (curve La and curve Lc) based on a Cu core ball diameter.

Figure 6:
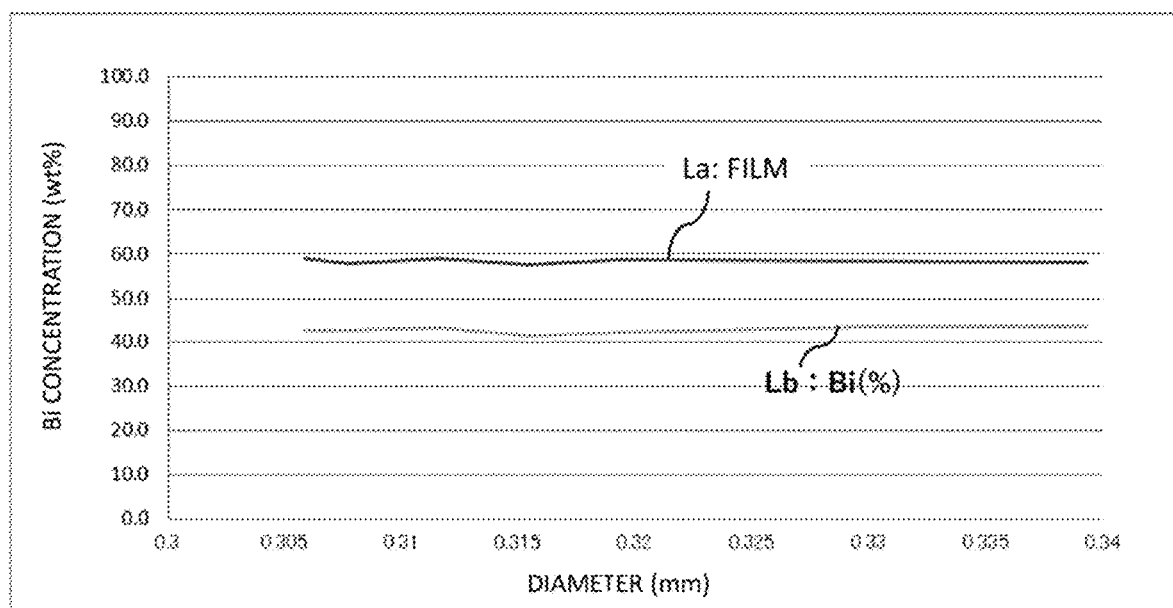
FIG. 6 is a characteristic curve graph illustrating a relationship between a concentration in Bi of a plating liquid in an electroplating treatment and a concentration of Bi contained in a solder plating layer based on a Cu core ball diameter in a (Sn-58Bi)-based solder alloy according to an embodiment of the present invention.

FIG. 6 illustrates a result obtained by measuring a particle diameter after a thickness of the solder plating layer 16 is monitored one by one, a Cu core ball when a thickness of the solder plating layer 16 sequentially increases by a predetermined value is collected as a sample every time in this example, the collected sample is washed and then dried in a case where a solder plating layer in which a target value of Bi is set to 58% by mass is formed in a circumferential edge of the core having a particle diameter of 300 μm as an initial value, as will be described in Examples 4 to 6 later. In a case where the Bi content in the solder plating layer when the particle diameter of the Cu core ball at measurement timing is a target value is measured sequentially, a result shown by the curve La of FIG. 6 was obtained. It can be shown that even when the solder plating layer 16 increases sequentially by a predetermined thickness as the result, the Bi content at that time is approximately the same as the immediately preceding content and the Bi content is approximately 58% by mass to 60% by mass. Accordingly, from the curve La of FIG. 6, it can be understood that the concentration distribution of Bi is homogeneous (uniform) with respect to the plating thickness, and there is no concentration gradient.

Figure 7:
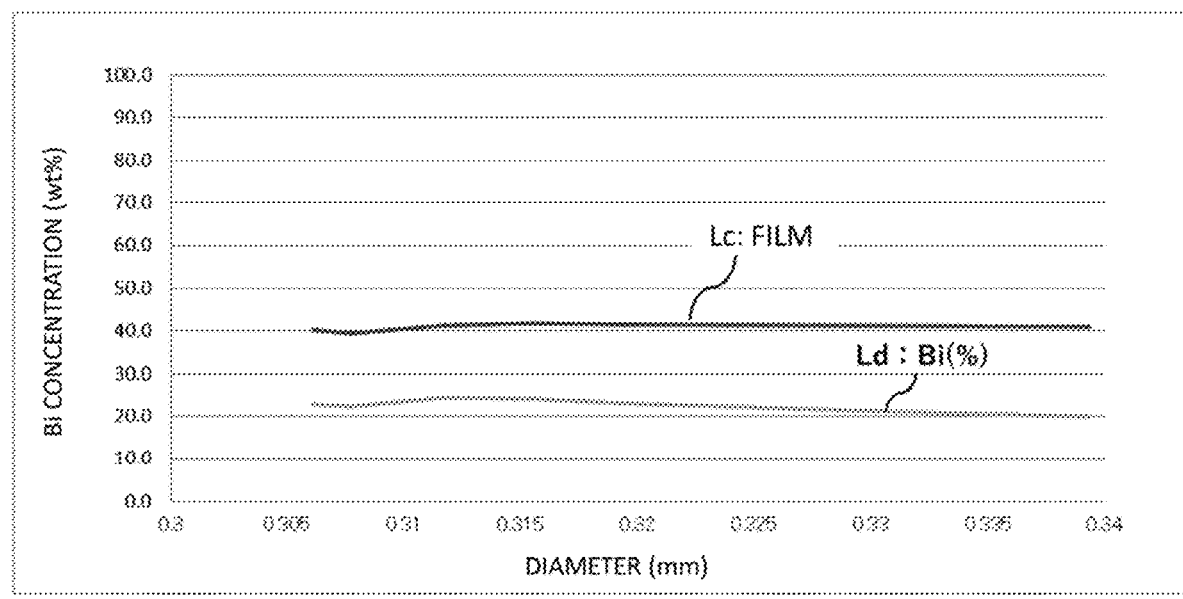
FIG. 7 is a characteristic curve graph illustrating a relationship between a concentration of Bi in a plating liquid in an electroplating treatment and a concentration of Bi contained in a solder plating layer based on a Cu core ball diameter in a (Sn-40Bi)-based solder alloy according to an embodiment of the present invention.
Figure 8:
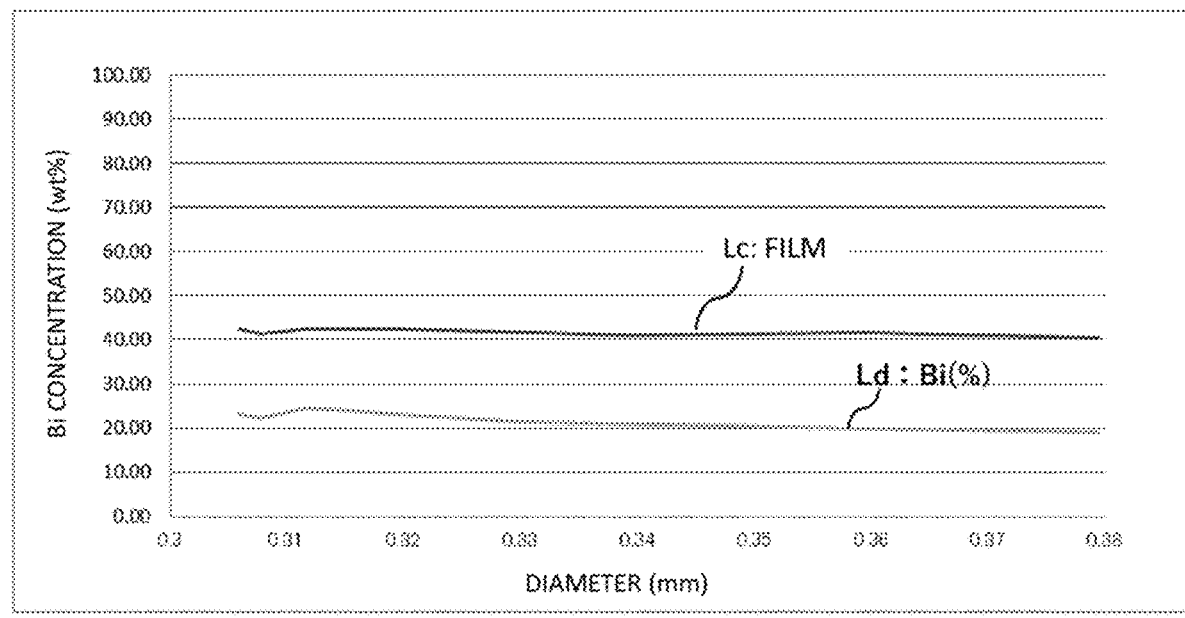
FIG. 8 is a graph corresponding to FIG. 7, and is the graph relating to a Cu core ball having a diameter larger than that of the Cu core ball illustrated in FIG. 7.

FIGS. 7 and 8 illustrate results obtained by measuring a particle diameter after a thickness of the solder plating layer 16 is monitored one by one, a Cu core ball when a thickness of the solder plating layer 16 sequentially increases by a predetermined value is collected as a sample every time in this example, the collected sample is washed and then dried in a case where a solder plating layer in which a target value of Bi is set to 40% by mass is formed in a circumferential edge of the core having a particle diameter of 300 μm as an initial value, as will be described in Examples 1 to 3, and Examples 7 to 9 later. In a case where the Bi content in the solder plating layer when the particle diameter of the Cu core ball at measurement timing is a target value is measured sequentially, a result shown by the curve Lc of FIGS. 7 and 8 is obtained. It can be shown that even when the solder plating layer 16 increases sequentially by a predetermined thickness as the result, the Bi content at that time is approximately the same as the immediately preceding content and the Bi content is approximately 40% by mass to 42% by mass. Accordingly, from the curve Lc of FIGS. 7 and 8, it can be understood that the concentration distribution of Bi is homogeneous (uniform) with respect to the plating thickness, and there is no concentration gradient. FIG. 7 is a graph for Examples 1 to 3 regarding a Cu core ball having a small diameter (340 μm), and FIG. 8 is a graph for Examples 7 to 9 regarding a Cu core ball having a large diameter (380 μm).

Figure 9:
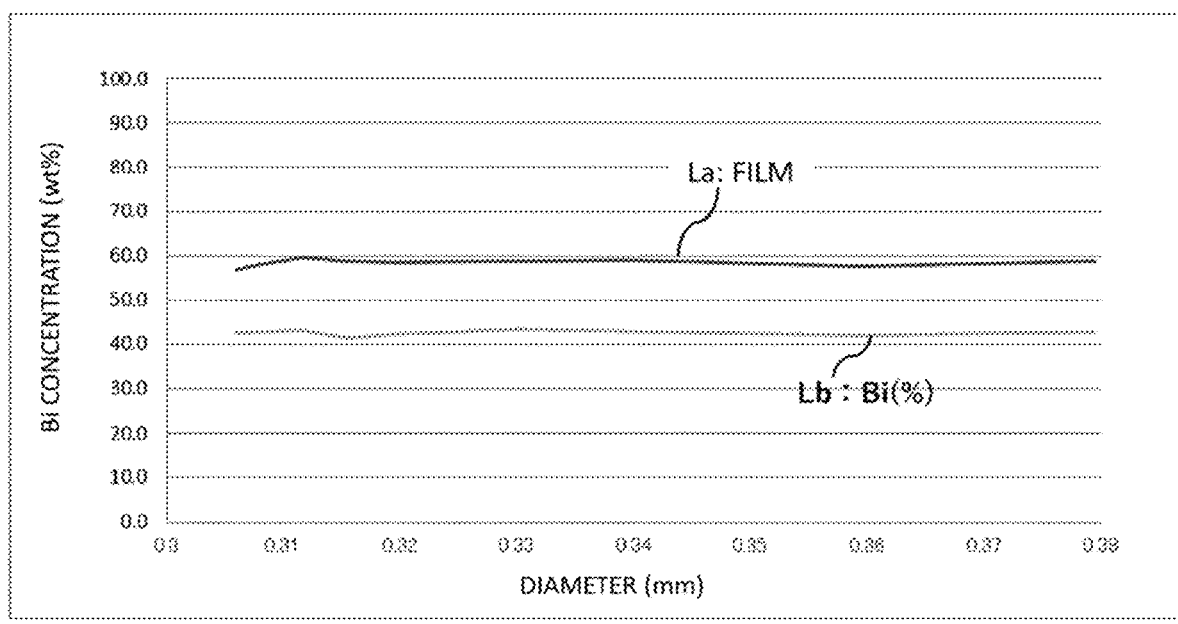
FIG. 9 is a graph corresponding to FIG. 6, and is the graph relating to a Cu core ball having a diameter larger than that of the Cu core ball illustrated in FIG. 6.

FIG. 9 illustrates a result obtained by measuring a particle diameter after a thickness of the solder plating layer 16 is monitored one by one, a Cu core ball when a thickness of the solder plating layer 16 sequentially increases by a predetermined value is collected as a sample every time in this example, the collected sample is washed and then dried in a case where a solder plating layer in which a target value of Bi for the cu core ball having a large diameter (380 μm) is set to 58% by mass is formed in a circumferential edge of the core having a particle diameter of 300 μm as an initial value.

Figure 3:
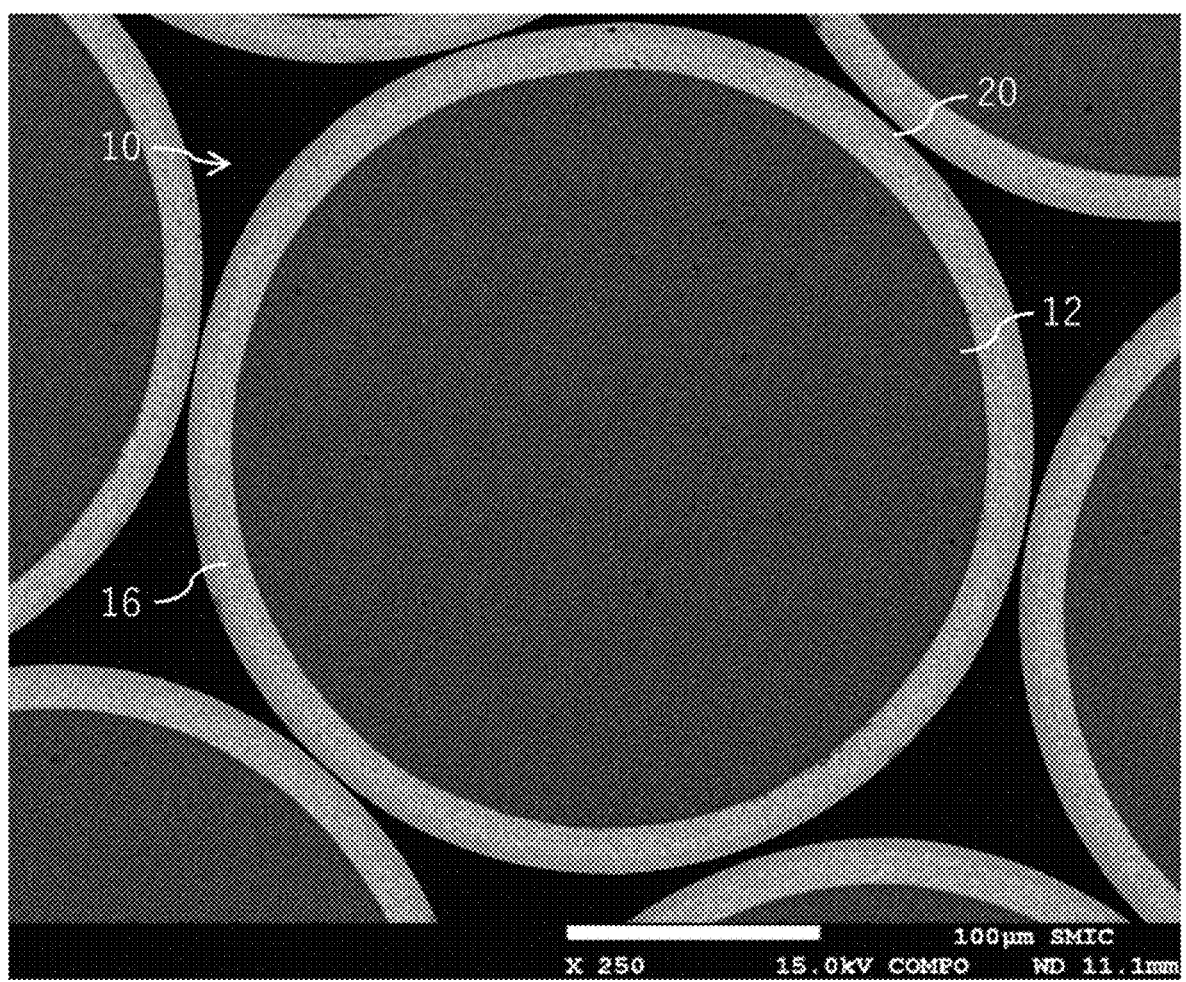
FIG. 3 is a cross-sectional photograph illustrating a distribution state of Sn and Bi according to an embodiment of the present invention.
Figure 4:
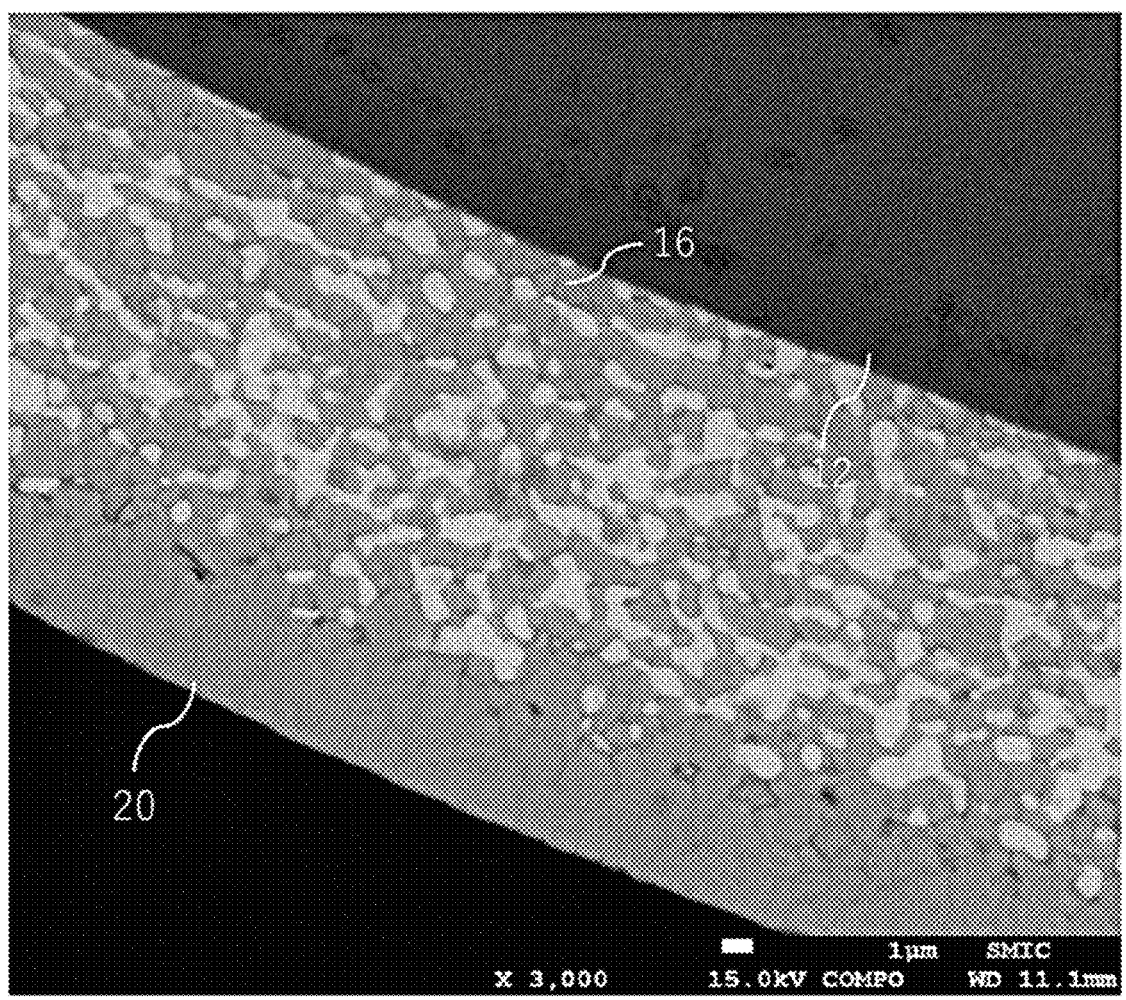
FIG. 4 is a cross-sectional photograph in which a part of the photograph illustrated in FIG. 3 is enlarged.
Figure 5:
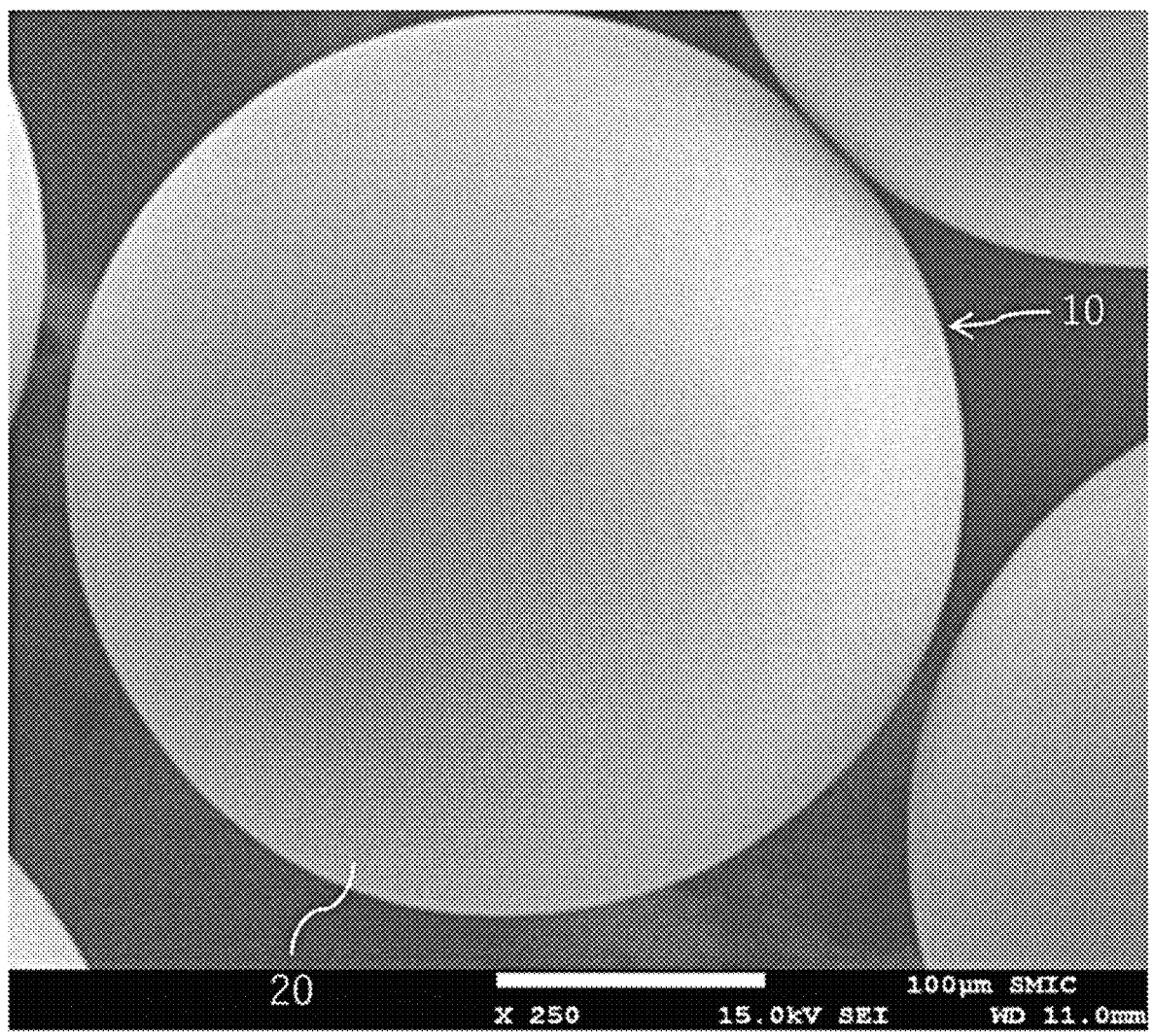
FIG. 5 is a photograph of a Cu core ball according to an embodiment of the present invention.

FIGS. 3 to 5 are images obtained by imaging the Cu core ball 10 in which the Sn plating layer 20 is formed on the outer side of the solder plating layer 16 by using FE-EPMA.

In FIGS. 3 and 4, it can be confirmed that Bi in the solder plating layer 16 is grown (precipitated) in a state of being approximately homogeneously distributed from a fact that the concentration of Bi in the solder plating layer 16 is maintained approximately in the same state even when the thickness of the solder plating layer 16 is grown. The plating treatment is performed in a state in which the Bi concentration in the plating liquid is homogenized so that the Bi concentration falls within a predetermined value. It can also be confirmed that the Cu core ball 10 has a silvery spherical shape (refer to FIG. 5).

In order to keep the concentration distribution of Bi in the solder plating layer 16 within the predetermined value, the plating treatment is performed while controlling the voltage and current. By such a plating treatment, the distribution of Bi in the solder plating layer 16 can be maintained at the predetermined value.

Since Bi in the plating liquid is introduced into the solder plating layer prior to Sn in the plating liquid, the Bi concentration in the solder plating layer 16, which is shown by the curve La, is not coincident with the Bi concentration in the plating liquid, which is shown by the curve Lb, and similarly the Bi concentration in the solder plating layer 16, which is shown by the curve Ld, is not coincident with the Bi concentration in the plating liquid, which is shown by the curve Lc.

It is desirable to refer to a content disclosed in JP 6217836 B1 regarding a fact that the concentration distribution of Bi in the solder plating layer 16 is a value corresponding to the target value.

Example

Hereinafter, the embodiment will be described in detail with reference to Examples and Comparative Examples. The embodiment is not limited to these Examples. In each of Examples 1 to 27 and Comparative Examples 1 to 27, which will be described later, the Bi concentration in the solder plating layer is 90% to 108.6% when being a concentration ratio (%)=an average value of measured values of Bi (% by mass)/a target Bi content (% by mass).

As an evaluation of the core ball having a composition shown in each Table which will be described later, an evaluation of yellowness and an evaluation of a defect at the time of bonding were performed based on the following criteria.

<Yellowness>

The yellowness of the core ball was measured by using a CM-2600d spectrophotometer manufactured by KONICA MINOLTA. The yellowness of 8.5 or less in the L*a*b* table color system was set to "Good" and indicated as "o" in each Table. The yellowness of more than 8.5 in the L*a*b* table color system was determined to be "defective" and indicated as "x" in each Table.

<Defect at the Time of Bonding>

Ten core balls (samples) having a composition in each Example and each Comparative Example, which are produced in the same production batch as each sample of which yellowness was measured, were prepared, and each core ball was bonded to a substrate by normal reflow processing. Regarding defects at the time of bonding, a case where a bonding defect was not measured in all the ten samples was indicated as "Good" and indicated as "o" in each Table. On the other hand, a case where misalignment or a ball missing is caused at the time of bonding in even one sample or a case where a core bursts open as the time of bonding in even one sample was determined to be "defective", and indicated as "x" in Table.

Table 1 below indicates Examples 1 to 9 in which copper is used as the core material. The total thickness of a thickness of the solder plating layer and a thickness of the Ni base plating layer 14 is 20 μm on one side in Examples 1 to 6, and 40 μm on one side in Examples 7 to 9. A configuration of the solder plating layer is Sn-40Bi-0.5Cu in Examples 1 to 3 and Examples 7 to 9, and Sn-58Bi in Examples 4 to 6. The thickness of the Sn plating layer provided on the outer circumferential side (outer surface) of the solder plating layer is 0.1 μm to 12 μm on one side, and the thickness of the Sn plating layer with respect to the thickness of the solder plating layer is 0.26% to 33.3%. When the yellowness and the defect at the time of bonding were determined in each of Examples 1 to 9 according to the above-mentioned criteria, preferable results were capable of being obtained in all Examples 1 to 9. A "Sn plating layer/solder plating layer (%)" shown in each Table is calculated by Expression of Sn plating layer thickness (one side)/solder plating layer (one side)×100.

TABLE 1

|  | Example 1 | Example 2 | Example 3 | Example 4 | Example 5 | Example 6 | Example 7 | Example 8 | Example 9 |
| --- | --- | --- | --- | --- | --- | --- | --- | --- | --- |
| Core Material | Copper | Copper | Copper | Copper | Copper | Copper | Copper | Copper | Copper |
| Solder Plating Layer Thickness + Ni Base Plating Layer Thickness | One side 20 μm | One side 20 μm | One side 20 μm | One side 20 μm | One side 20 μm | One side 20 μm | One side 20 μm | One side 20 μm | One side 20 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | A | A | A | B | B | B | C | C | C |
| Sn Plating Layer Thickness (μm) | One side 0.1 | One side 0.5 | One side 6 | One side 0.1 | One side 0.5 | One side 6 | One side 0.1 | One side 0.5 | One side 12 |
| Sn Plating Layer/Solder Plating Layer (%) | 0.56 | 2.78 | 33.3 | 0.56 | 2.78 | 33.3 | 0.26 | 1.32 | 31.6 |
| Yellowness | o | o | o | o | o | o | o | o | o |
| Defect at Time of Bonding | o | o | o | o | o | o | o | o | o |

Comparative Examples 1 to 9 shown in Table 2 below were prepared as Examples corresponding to Examples 1 to 9. Copper is used as the core material even in Comparative Examples 1 to 9. The total thickness of a thickness of the solder plating layer and a thickness of the Ni base plating layer 14 is 20 μm on one side in Comparative Examples 1 to 6, and 40 μm on one side in comparative Examples 7 to 9. A configuration of the solder plating layer is Sn-40Bi-0.5Cu in Comparative Examples 1 to 3 and Comparative Examples 7 to 9, and Sn-58Bi in Comparative Examples 4 to 6. An aspect in which the Sn plating layer provided on the outer circumferential side (outer surface) of the solder plating layer is not provided (Comparative Examples 1, 4 and 7), an aspect in which the Sn plating layer provided on the outer circumferential side (outer surface) of the solder plating layer is thin, (Comparative Examples 2, 5 and 8), and an aspect in which the Sn plating layer provided on the outer circumferential side (outer surface) of the solder plating layer is thick (Comparative Examples 3, 6 and 9) were prepared. When the yellowness and the defect at the time of bonding were determined in each of Comparative Examples 1 to 9 according to the above-mentioned criteria, unpreferable results were obtained in any of the yellowness and the defect at the time of bonding in all Comparative Examples 1 to 9.

When the Sn plating layer is thick, speed of a volume expansion between the Sn plating layer and the solder plating layer is different. Therefore, defects at the time of bonding such as misalignment, a ball missing, and bursting open are considered. On the other hand, when the Sn plating layer is thin, it is considered that an effect of applying the Sn plating layer was not capable of being sufficiently obtained and a defect due to the yellowness occurred. When the Sn plating layer is thin as described above, the oxide film becomes thick, a melting behavior at the time of a substrate reflow deteriorates. This may cause the core ball to come off the electrode pad (ball missing) or cause misalignment, which is not preferable. Since the same tendency was capable of being confirmed in Comparative Examples 10 to 27, which will be described later, the above idea applies to all of Comparative Examples 10 to 27.

Comparative Examples 10 to 18 shown in Table 4 below were prepared as Examples corresponding to Examples 10 to 18. A resin is used as the core material even in Comparative Examples 10 to 18. The total thickness of a thickness of the solder plating layer and a thickness of the Ni base plating layer 14 is 20 μm on one side in Comparative Examples 10

TABLE 2

|  | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 |
|---|---|---|---|---|---|---|---|---|---|
| Core Material | Copper | Copper | Copper | Copper | Copper | Copper | Copper | Copper | Copper |
| Solder Plating Layer Thickness + Ni Base Plating Layer Thickness | One side 20 μm | One side 20 μm | One side 20 μm | One side 20 μm | One side 20 μm | One side 20 μm | One side 40 μm | One side 40 μm | One side 40 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | A | A | A | B | B | B | C | C | C |
| Sn Plating Layer Thickness (μm) | One side 0 | One side 0.03 | One side 10 | One side 0 | One side 0.03 | One side 10 | One side 0 | One side 0.03 | One side 15 |
| Sn Plating Layer/Solder Plating Layer (%) | 0 | 0.17 | 55.6 | 0 | 0.17 | 55.6 | 0 | 0.08 | 39.5 |
| Yellowness | x | x | ○ | x | x | ○ | x | x | ○ |
| Defect at Time of Bonding | ○ | ○ | x | ○ | ○ | x | ○ | ○ | x |

Table 3 below indicates Examples 10 to 18 in which a styrene-butadiene block copolymer, which is a resin, was used as the core material. The total thickness of a thickness of the solder plating layer and a thickness of the Ni base plating layer 14 is 20 μm on one side in Examples 10 to 15, and 40 μm on one side in Examples 16 to 18. A configuration of the solder plating layer is Sn-40Bi-0.5Cu in Examples 10 to 12 and Examples 16 to 18, and Sn-58Bi in Examples 13 to 15. The thickness of the Sn plating layer provided on the outer circumferential side (outer surface) of the solder plating layer is 0.1 μm to 12 μm on one side, and the thickness of the Sn plating layer with respect to the thickness of the solder plating layer is 0.26% to 33.3%. When the yellowness and the defect at the time of bonding were determined in each of Examples 10 to 18 according to the above-mentioned criteria, preferable results were capable of being obtained in all Examples 10 to 18.

to 15, and 40 μm on one side in comparative Examples 16 to 18. A configuration of the solder plating layer is Sn-40Bi-0.5Cu in Comparative Examples 10 to 12 and Comparative Examples 16 to 18, and Sn-58Bi in Comparative Examples 13 to 15. An aspect in which the Sn plating layer provided on the outer circumferential side (outer surface) of the solder plating layer is not provided (Comparative Examples 10, 13 and 16), an aspect in which the Sn plating layer provided on the outer circumferential side (outer surface) of the solder plating layer is thin, (Comparative Examples 11, 14 and 17), and an aspect in which the Sn plating layer provided on the outer circumferential side (outer surface) of the solder plating layer is thick (Comparative Examples 12, 15 and 18) were prepared. When the yellowness and the defect at the time of bonding were determined in each of Comparative Examples 10 to 18 according to the above-mentioned criteria, unpreferable results were obtained in any of the yellowness and the defect at the time of bonding.

TABLE 3

|  | Example 10 | Example 11 | Example 12 | Example 13 | Example 14 | Example 15 | Example 16 | Example 17 | Example 18 |
|---|---|---|---|---|---|---|---|---|---|
| Core Material | Resin | Resin | Resin | Resin | Resin | Resin | Resin | Resin | Resin |
| Solder Plating Layer Thickness + Ni Base Plating Layer Thickness | One side 20 μm | One side 20 μm | One side 20 μm | One side 20 μm | One side 20 μm | One side 20 μm | One side 40 μm | One side 40 μm | One side 40 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | D | D | D | E | E | E | F | F | F |
| Sn Plating Layer Thickness (μm) | One side 0.1 | One side 0.5 | One side 6 | One side 0.1 | One side 0.5 | One side 6 | One side 0.1 | One side 0.5 | One side 12 |
| Sn Plating Layer/Solder Plating Layer (%) | 0.56 | 2.78 | 33.3 | 0.56 | 2.78 | 33.3 | 0.26 | 1.32 | 31.6 |
| Yellowness | ○ | ○ | ○ | ○ | ○ | ○ | ○ | ○ | ○ |
| Defect at Time of Bonding | ○ | ○ | ○ | ○ | ○ | ○ | ○ | ○ | ○ |

TABLE 4

|  | Comparative Example 10 | Comparative Example 11 | Comparative Example 12 | Comparative Example 13 | Comparative Example 14 | Comparative Example 15 | Comparative Example 16 | Comparative Example 17 | Comparative Example 18 |
| --- | --- | --- | --- | --- | --- | --- | --- | --- | --- |
| Core Material | Resin | Resin | Resin | Resin | Resin | Resin | Resin | Resin | Resin |
| Solder Plating Layer Thickness + Ni Base Plating Layer Thickness | One side 20 μm | One side 20 μm | One side 20 μm | One side 20 μm | One side 20 μm | One side 20 μm | One side 40 μm | One side 40 μm | One side 40 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | D | D | D | E | E | E | F | F | F |
| Sn Plating Layer Thickness (μm) | One side 0 | One side 0.03 | One side 10 | One side 0 | One side 0.03 | One side 10 | One side 0 | One side 0.03 | One side 15 |
| Sn Plating Layer/Solder Plating Layer (%) | 0 | 0.17 | 55.6 | 0 | 0.17 | 55.6 | 0 | 0.08 | 39.5 |
| Yellowness | x | x | ○ | x | x | ○ | x | x | ○ |
| Defect at Time of Bonding | ○ | ○ | x | ○ | ○ | x | ○ | ○ | x |

Table 5 below indicates Examples 19 to 27 in which aluminum is used as the core material. The total thickness of a thickness of the solder plating layer and a thickness of the Ni base plating layer 14 is 20 μm on one side in Examples 19 to 24, and 40 μm on one side in Examples 25 to 27. A configuration of the solder plating layer is Sn-40Bi-0.5Cu in Examples 19 to 21 and Examples 25 to 27, and Sn-58Bi in Examples 22 to 24. The thickness of the Sn plating layer provided on the outer circumferential side (outer surface) of the solder plating layer is 0.1 μm to 12 μm on one side, and the thickness of the Sn plating layer with respect to the thickness of the solder plating layer is 0.26% to 33.3%. When the yellowness and the defect at the time of bonding were determined in each of Examples 19 to 27 according to the above-mentioned criteria, preferable results were capable of being obtained in all Examples 19 to 27.

Comparative Examples 19 to 27 shown in Table 6 below were prepared as Examples corresponding to Examples 19 to 27. Aluminum is used as the core material even in Comparative Examples 19 to 27. The total thickness of a thickness of the solder plating layer and a thickness of the Ni base plating layer 14 is 20 μm on one side in Comparative Examples 19 to 24, and 40 μm on one side in Comparative Examples 25 to 27. A configuration of the solder plating layer is Sn-40Bi-0.5Cu in Comparative Examples 19 to 21 and Comparative Examples 25 to 27, and Sn-58Bi in Comparative Examples 22 to 24. An aspect in which the Sn plating layer provided on the outer circumferential side (outer surface) of the solder plating layer is not provided (Comparative Examples 19, 22 and 25), an aspect in which the Sn plating layer provided on the outer circumferential side (outer surface) of the solder plating layer is thin,

TABLE 5

|  | Example 19 | Example 20 | Example 21 | Example 22 | Example 23 | Example 24 | Example 25 | Example 26 | Example 27 |
| --- | --- | --- | --- | --- | --- | --- | --- | --- | --- |
| Core Material | Aluminum | Aluminum | Aluminum | Aluminum | Aluminum | Aluminum | Aluminum | Aluminum | Aluminum |
| Solder Plating Layer Thickness + Ni Base Plating Layer Thickness | One side 20 μm | One side 20 μm | One side 20 μm | One side 20 μm | One side 20 μm | One side 20 μm | One side 40 μm | One side 40 μm | One side 40 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | G | G | G | H | H | H | I | I | I |
| Sn Plating Layer Thickness (μm) | One side 0.1 | One side 0.5 | One side 6 | One side 0.1 | One side 0.5 | One side 6 | One side 0.1 | One side 0.5 | One side 12 |
| Sn Plating Layer/Solder Plating Layer (%) | 0.56 | 2.78 | 33.3 | 0.56 | 2.78 | 33.3 | 0.26 | 1.32 | 31.6 |
| Yellowness | ○ | ○ | ○ | ○ | ○ | ○ | ○ | ○ | ○ |
| Defect at Time of Bonding | ○ | ○ | ○ | ○ | ○ | ○ | ○ | ○ | ○ |

(Comparative Examples 20, 23 and 26), and an aspect in which the Sn plating layer provided on the outer circumferential side (outer surface) of the solder plating layer is thick (Comparative Examples 21, 24 and 27) were prepared. When the yellowness and the defect at the time of bonding were determined in each of Comparative Examples 19 to 27 according to the above-mentioned criteria, unpreferable results were obtained in any of the yellowness and the defect at the time of bonding.

TABLE 6

| | Comparative Example 19 | Comparative Example 20 | Comparative Example 21 | Comparative Example 22 | Comparative Example 23 | Comparative Example 24 | Comparative Example 25 | Comparative Example 26 | Comparative Example 27 |
|---|---|---|---|---|---|---|---|---|---|
| Core Material | Aluminum | Aluminum | Aluminum | Aluminum | Aluminum | Aluminum | Aluminum | Aluminum | Aluminum |
| Solder Plating Layer Thickness + Ni Base Plating Layer Thickness | One side 20 μm | One side 20 μm | One side 20 μm | One side 20 μm | One side 20 μm | One side 20 μm | One side 40 μm | One side 40 μm | One side 40 μm |
| Composition of Solder Plating Layer | Sn—40Bi—0.5Cu | Sn—40Bi—0.5Cu | Sn—40Bi—0.5Cu | Sn—58Bi | Sn—58Bi | Sn—58Bi | Sn—40Bi—0.5Cu | Sn—40Bi—0.5Cu | Sn—40Bi—0.5Cu |
| Bi Concentration Ratio Group | G | G | G | H | H | H | I | I | I |
| Sn Plating Layer Thickness (μm) | One side 0 | One side 0.03 | One side 10 | One side 0 | One side 0.03 | One side 10 | One side 0 | One side 0.03 | One side 15 |
| Sn Plating Layer/Solder Plating Layer (%) | 0 | 0.17 | 55.6 | 0 | 0.17 | 55.6 | 0 | 0.08 | 39.5 |
| Yellowness | x | x | ○ | x | x | ○ | x | x | ○ |
| Defect at Time of Bonding | ○ | ○ | x | ○ | ○ | x | ○ | ○ | x |

The Cu core ball 10 in which a target composition of the solder plating layer 16 in Examples and Comparative Examples is (Sn-58Bi) was prepared under the following conditions.

Diameter of core 12: 300 μm
Film thickness of Ni base plating layer 14: 2 μm on one side
Film thickness of solder plating layer 16: 18 μm or 38 μm on one side
Diameter of Cu core ball 10 excluding Sn plating layer 20: 340 μm or 380 μm In a plating method for the Ni base plating layer 14, an electroplating method (barrel electroplating) was used for the samples in Tables 1 and 2 in which the core is formed of Cu, an electroless plating method was used for the samples in Tables 3 and 4 in which the core is formed of a resin, and a method in which for the samples in Tables 5 and 6 in which the core is formed of aluminum, a double zincate treatment is performed on aluminum which is the core, Ni is plated thin on the aluminum subjected to the double zincate treatment by the electroless plating, and then the core is caused to grow to have a target thickness of 2 μm on one side by the electroplating method.

The plating method for the solder plating layer 16 was set to be under conditions in FIG. 6 by the electroplating method (barrel electroplating).

When the thickness of the solder plating layer 16, which is thin, is 18 μm on one side, the diameter of the Cu core ball 10 excluding the Sn plating layer 20 is 340 μm. On the other hand, when the thickness of the solder plating layer 16, which is thick, is 38 μm on one side, the diameter of the Cu core ball 10 excluding the Sn plating layer 20 is 380 μm.

The Cu core ball 10 in which a target composition of the solder plating layer 16 in Examples and Comparative Examples is (Sn-40Bi-0.5Cu) was prepared under the following conditions.

Diameter of core 12: 300 μm
Film thickness of Ni base plating layer 14: 2 μm on one side
Film thickness of solder plating layer 16: 18 μm or 38 μm on one side
Diameter of Cu core ball 10 excluding Sn plating layer 20: 340 μm or 380 μm In a plating method for the Ni base plating layer 14, an electroplating method (barrel electroplating) was used for the samples in Tables 1 and 2 in which the core is formed of Cu, an electroless plating method was used for the samples in Tables 3 and 4 in which the core is formed of a resin, and a method in which for the samples in Tables 5 and 6 in which the core is formed of aluminum, a double zincate treatment is performed on aluminum which is the core, Ni is plated thin on the aluminum subjected to the double zincate treatment by the electroless plating, and then the core is caused to grow to have a target thickness of 2 μm on one side by the electroplating method.

The plating method for the solder plating layer 16 was set to be under conditions in FIG. 7 or 8 by the electroplating method (barrel electroplating).

When the thickness of the solder plating layer 16, which is thin, is 18 μm on one side, the diameter of the Cu core ball 10 excluding the Sn plating layer 20 is 340 μm. On the other hand, when the thickness of the solder plating layer 16, which is thick, is 38 μm on one side, the diameter of the Cu core ball 10 excluding the Sn plating layer 20 is 380 μm.

After the Cu core ball provided with the solder plating layer 16 was pulled up from a molten liquid containing Sn and Bi, the Sn plating layer 20 was immersed in the molten liquid of Sn to be formed. More specifically, the sample on which the solder plating layer 16 was formed was taken out from the plating liquid containing Sn and Bi, washed, and dried.

After that, the sample was put into a plating liquid containing methane sulfonic acid Sn, an organic acid and a surfactant, and the barrel electroplating was performed until the sample has the thickness of the Sn plating layer 20 described in each Example and each Comparative example (excluding Comparative example in which the Sn plating layer 20 is not formed).

The Bi concentration in Bi concentration ratio groups (A to I) in Tables 1 to 6 above and a specification of each region are shown in Tables 7 and 8 below. As shown in Table 7, it was capable of being confirmed that the Bi concentration ratio was within the allowable range in all of the Bi concentration ratio groups (A to I). The samples of which the Bi concentration was measured in Tables 7 and 8 are other samples in the same Bi concentration ratio group, which was prepared in the same manufacturing batch as that of the samples of which the yellowness or the defect at the time of bonding was measured in Tables 1 to 6 above. All the samples of which the Bi concentration was measured in Tables 7 and 8 are measured for the Bi concentration without forming the Sn plating layer 20.

respectively and then the Bi concentration was measured by a quantitative analysis. When the thickness of the solder plating layer 16, which is thick, is 38 μm on one side, a thickness of the inner layer 16a was set to 14.9 μm from the surface of the core 12, a thickness of the intermediate layer 16b was set from 14.9 μm to 28.1 μm and a thickness of the outer layer 16c was set from 28.1 μm to 38.0 μm. Regions 17a, 17b, and 17c which have a thickness of 7.5 μm and a width of 60 μm were cut out from the inner layer 16a, the intermediate layer 16b, and the outer layer 16c, respectively and then the Bi concentration was measured by a quantitative analysis. The above work was performed on the inner

TABLE 7

Distribution of Bi (wt %)

| Group | Allowable Range | Actual Measurement of Inner Side | Concentration | Actual Measurement of Intermediate Side | Concentration | Actual Measurement of Outer Side | Concentration |
| --- | --- | --- | --- | --- | --- | --- | --- |
| A | 90 to 107.5 | 41.5 | 103.8 | 41.0 | 102.5 | 40.2 | 100.5 |
| B | 91.4 to 108.6 | 59.8 | 103.1 | 59.0 | 101.7 | 58.2 | 100.3 |
| C | 90 to 107.5 | 42.2 | 105.5 | 41.1 | 102.8 | 39.5 | 98.8 |
| D | 90 to 107.5 | 42.9 | 107.3 | 42.1 | 105.3 | 41.2 | 103.0 |
| E | 91.4 to 108.6 | 50.3 | 104.0 | 59.3 | 102.2 | 58.5 | 100.9 |
| F | 90 to 107.5 | 41.2 | 103.0 | 39.6 | 99.0 | 40.6 | 101.5 |
| G | 90 to 107.5 | 37.5 | 93.8 | 42.1 | 105.3 | 41.2 | 103.0 |
| H | 91.4 to 108.6 | 50.3 | 104.0 | 59.3 | 102.2 | 58.5 | 100.9 |
| I | 90 to 107.5 | 41.2 | 103.0 | 39.6 | 99.0 | 40.6 | 101.5 |

TABLE 8

Specific of Each Region

| Group | Definition of Inner Side (μm) | Definition of Intermediate Side (μm) | Definition of Outer Side (μm) | Cut Out Region (μm) |
| --- | --- | --- | --- | --- |
| A | Core Surface to 7.0 | 7.0 to 13.3 | 13.3 to 16.0 | Length × 5 μm, Width × 40 μm |
| B | Core Surface to 7.0 | 7.0 to 13.3 | 13.3 to 18.0 | Length × 5 μm, Width × 40 μm |
| C | Core Surface to 14.9 | 14.9 to 28.1 | 28.1 to 38.0 | Length × 7.5 μm, Width × 60 μm |
| D | Core Surface to 7.0 | 7.0 to 13.3 | 13.3 to 18.0 | Length × 5 μm, Width × 40 μm |
| E | Core Surface to 7.0 | 7.0 to 13.3 | 13.3 to 18.0 | Length × 5 μm, Width × 40 μm |
| F | Core Surface to 14.9 | 14.9 to 28.1 | 28.1 to 38.0 | Length × 7.5 μm, Width × 60 μm |
| G | Core Surface to 7.0 | 7.0 to 13.3 | 13.3 to 18.0 | Length × 5 μm, Width × 40 μm |
| H | Core Surface to 7.0 | 7.0 to 13.3 | 13.3 to 18.0 | Length × 5 μm, Width × 40 μm |
| I | Core Surface to 14.9 | 14.9 to 28.1 | 28.1 to 38.0 | Length × 7.5 μm, Width × 60 μm |

Figure 10:
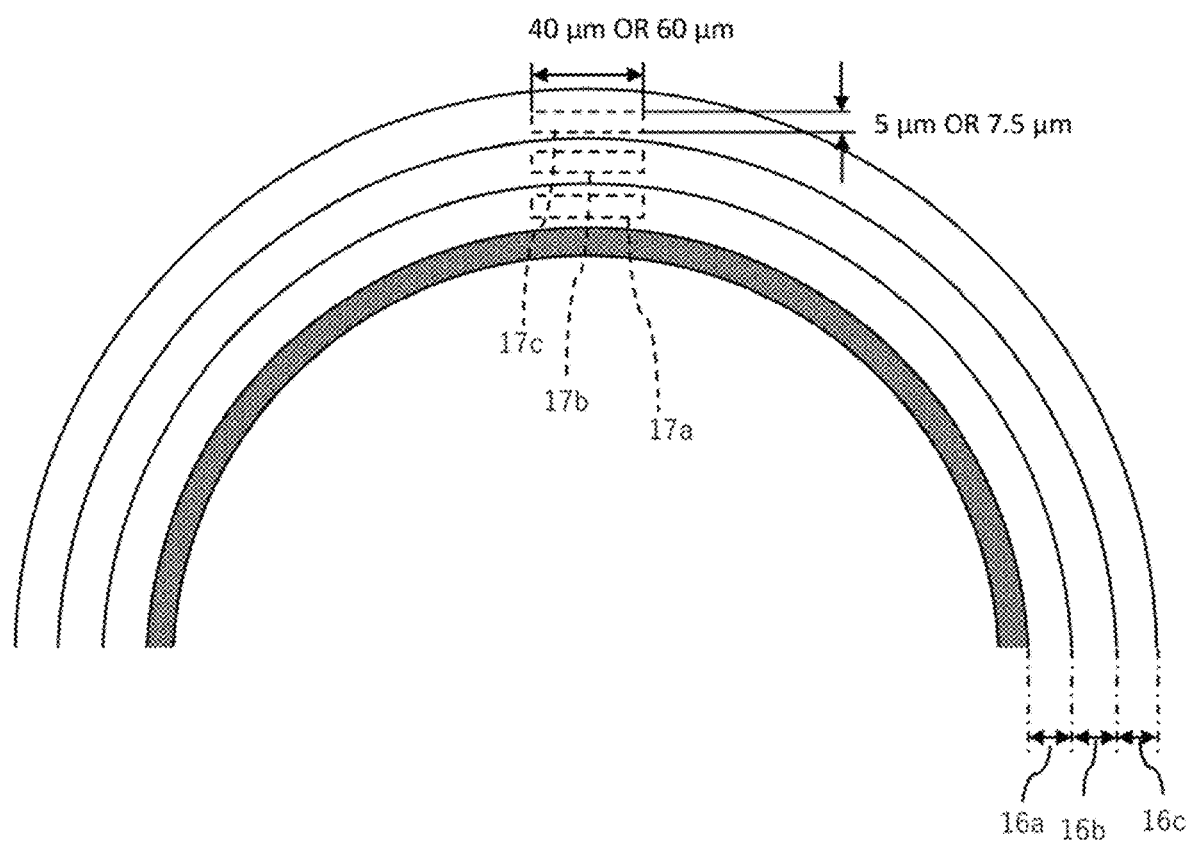
FIG. 10 is an explanatory diagram illustrating an example of a method for measuring a concentration distribution of Bi in a core material according to an embodiment of the present invention.

Tables 7 and 8 will be described with reference to FIG. 10. The solder plating layer 16 was divided into an inner layer 16a, an intermediate layer 16b, and an outer layer 16c from the surface side of the core 12 for convenience. When the thickness of the solder plating layer 16, which is thin, is 18 μm on one side, a thickness of the inner layer 16a was set to 7 μm from the surface of the core 12, a thickness of the intermediate layer 16b was set from 7 μm to 13.3 μm and a thickness of the outer layer 16c was set from 13.3 μm to 18.0 μm. Regions 17a, 17b, and 17c which have a thickness of 5 μm and a width of 40 μm were cut out from the inner layer 16a, the intermediate layer 16b, and the outer layer 16c, layer 16a, the intermediate layer 16b, and the outer layer 16c of one sample belonging to each group (A to I), respectively. The values are shown in Table 7. FE-EPMAJXA-8530F manufactured by JEOL Ltd. was used as an observation equipment.

Table 9 below shows the allowable range of the Bi concentration ratio in a case where the target composition of the solder plating layer 16 is Sn-40Bi-0.5Cu-0.03Ni and in a case where the target composition of the solder plating layer 16 is Sn-3Ag-0.8Cu-3Bi. Accordingly, it can be confirmed that when the target composition of the solder plating layer 16 is Sn-40Bi-0.5Cu-0.03Ni, the allowable range is 90% by mass to 107.5% by mass, and when the target composition of the solder plating layer 16 is Sn-3Ag-0.8Cu-3Bi, the allowable range is 90% by mass to 106.7% by mass.

TABLE 9

| | | Allowable Range | | | |
|---|---|---|---|---|---|
| | | Minimum | | Maximum | |
| | Target Value (% by Mass) | % by Mass | Concentration Ratio % (% by Mass/Target Value) | % by Mass | Concentration Ratio % (% by Mass/Target Value) |
| Sn-58Bi | 58 | 53 | 91.4 | 63 | 108.6 |
| Sn-40Bi-0.5Cu-0.03Ni | 40 | 36 | 90 | 43 | 107.5 |
| Sn-3Ag-0.8Cu-3Bi | 3 | 2.7 | 90 | 3.2 | 106.7 |

The description of the embodiment, the description of the example, and the illustration of the drawings, which are described above, are merely examples for explaining the invention described in the scope of the claim, and the invention which is described in the scope of the claim is not limited by the description of the embodiment or the illustration of the drawings, which are described above.

The shape of the core material includes a shape other than the sphere, and also includes a columnar column, a sheet shape. For example, a Ni base plating layer and a Co base plating layer, which have a thickness of 1 μm to 4 μm on one side, are provided on a surface of a column formed of Cu (diameter of upper surface and bottom surface: 1 μm to 1000 μm, and height: 1 μm to 3000 μm), a Cu core column coated with the (Sn—Bi)-based solder plating layer has the Bi concentration ratio in the solder plating layer in a predetermined range of 90% to 108.6% in the same conditions as Example, and the defective bonding is not caused like the Cu core ball of Examples described above.

REFERENCE SIGNS LIST

10 Cu core ball
12 core
14 base plating layer
16 solder plating layer (solder layer)
20 Sn plating layer (Sn layer)
16a inner layer
16b intermediate layer
16c outer layer
17a to 17c segment (measurement region)

The invention claimed is:

1. A core material comprising:
a core having 0.95 to 1.0 sphericity;
a solder layer made of a (Sn-58Bi)-based solder alloy provided on an outer side of the core; and
a Sn layer provided on an outer side of the solder layer, wherein
when a concentration ratio of Bi contained in the solder layer is a concentration ratio=a measured value of Bi/a target Bi content, the concentration ratio is 91.4% to 108.6%, or
when the concentration ratio of Bi contained in the solder layer is a concentration ratio=an average value of measured values of Bi/a target Bi content, the concentration ratio is 91.4% to 108.6%,
a thickness of the solder layer on one side is 1 μm or more and 100 μm or less,
a thickness of the Sn layer is 0.1 μm to 12 μm on one side,
the thickness of the Sn layer is 0.215% or more and 36% or less of the thickness of the solder layer, and
the core material has a yellowness of 8.5 or less in a L*a*b* table color system, and when ten sample core materials produced in a same production batch as the core material having the yellowness of 8.5 or less are bonded to a substrate by reflow processing, none of the ten sample core materials exhibit a defect at a time of bonding.

2. The core material according to claim 1, wherein a base plating layer made of one or more elements selected from Ni and Co is provided between the core and the solder layer.

3. The core material according to claim 1, wherein a Cu ball is used as the core.

4. A method for forming bump electrode comprising steps of:
mounting the core material according to claim 1, on an electrode;
forming a bump electrode by heating the mounted core material.

* * * * *